United States Patent [19]

Uchida

[11] Patent Number: 4,479,202
[45] Date of Patent: Oct. 23, 1984

[54] CMOS SENSE AMPLIFIER

[75] Inventor: Yukimasa Uchida, Yokohama, Japan

[73] Assignee: Tokyo Shibaura Denki Kabushiki Kaisha, Kawasaki, Japan

[21] Appl. No.: 493,604

[22] Filed: May 11, 1983

Related U.S. Application Data

[62] Division of Ser. No. 186,768, Sep. 12, 1980, abandoned.

[30] Foreign Application Priority Data

Sep. 13, 1979 [JP] Japan .................. 54-116771

[51] Int. Cl.³ .................. G11C 7/06; H03K 5/24
[52] U.S. Cl. .................. 365/190; 307/530; 365/205
[58] Field of Search .............. 307/355, 362, 530, 279; 365/190, 205, 207, 208; 330/253

[56] References Cited

U.S. PATENT DOCUMENTS

| | | | |
|---|---|---|---|
| 3,509,379 | 4/1970 | Rapp ............................. | 307/279 |
| 3,916,430 | 10/1975 | Heuner et al. ................ | 307/279 X |
| 3,947,778 | 3/1976 | Hsiao et al. .................. | 330/253 |
| 4,004,158 | 1/1977 | Morgan ......................... | 307/362 |
| 4,048,575 | 9/1977 | Musa ............................ | 330/253 |
| 4,103,345 | 7/1978 | Suzuki et al. ................. | 365/190 |
| 4,136,292 | 1/1979 | Suzuki et al. ................. | 307/355 |
| 4,162,540 | 7/1979 | Ando ............................ | 365/190 X |
| 4,169,233 | 9/1979 | Haraszti ....................... | 307/355 |
| 4,336,465 | 6/1982 | Nakano et al. ............... | 307/530 X |

OTHER PUBLICATIONS

G. F. Landsburg, *A Two-Chip CMOS CODEC,* 1978 IEEE International Solid-State Circuits Conference, p. 180.
RCA, *COS/MOS Integrated Circuits Manual,* 26, 2d Ed. (1972).
F. H. Musa, *A CMOS Monolithic 3½-Digit A/D Converter,* 1976 IEEE International Solid-State Circuits Conference, p. 144.
M. R. Guidry, *A Sense Amplifier for a Low Clock Capacitance 16K CCD Memory,* 1976 IEEE International Solid-State Circuit Conference, p. 190.
K. Ochii, *C²MOS 4K Static RAM,* 1977 IEEE International Solid-State Circuits Conference, p. 18.
Schlageter, "Two 4K Static 5-V RAMS", IEEE-JSSC, vol. SC-11, No. 5, pp. 602-608, 10/1976.
Minato et al., "A High-Speed Low-Power HI-CMOS 4K Static RAM", IEEE-Trans. on Electron Devices, vol. ED-26, No. 6, pp. 882-885, 6/79.

*Primary Examiner*—Larry N. Anagnos
*Attorney, Agent, or Firm*—Finnegan, Henderson, Farabow, Garrett & Dunner

[57] ABSTRACT

A memory circuit comprises a plurality of memory cells and a plurality of sense circuits each including first and second input MOS transistors and first and second load MOS transistors of a first channel type and a load circuit connected to the sense circuit and including first to fourth load MOS transistors of a second channel type. The first and second input MOS transistors have their sources connected to each other and their gates connected to receive a differential input signal therebetween from said memory circuits of the first and second switching transistors which have their sources connected respectively to the drains of said first and second input transistors and their gates connected to a column selection signal. The first and second load MOS transistors have their drains connected in common to the drain of the first switching MOS transistors and their sources connected to each other. The third and fourth load MOS transistors have their drains connected in common to the drain of the second switching MOS transistors and their sources connected to each other. The gates of the first and fourth load MOS transistors are coupled respectively to the drains of the first and second switching MOS transistors, and the gates of the second and third load MOS transistors are cross-coupled to the drains of the second and first switching MOS transistors, respectively.

5 Claims, 2 Drawing Figures

CMOS SENSE AMPLIFIER

This is a division of application Ser. No. 186,768 filed 9/12/80, now abandoned.

This invention relates to a sense amplifier, and more specifically to a static CMOS sense amplifier.

Heretofore, there have been developed various sense amplifiers using MOS transistors. Sense amplifiers may be classified into two types; dynamic and static. Dynamic sense amplifiers can amplify a very small differential input signal of several millivolts at a high speed by using clock pulses. On the other hand, static amplifiers cannot use clock pulses, so it is hard for them to amplify the very small differential input signal at a high speed. Among such static sense amplifiers, however, CMOS static amplifiers using complementary MOS transistors can perform signal amplification at a relatively high speed.

As one of the prior art CMOS sense amplifiers, there is a CMOS amplifier which has conventionally been used also for linear amplification or analog signal amplification. As stated in an article entitled "A High-Speed Low-Power Hi-CMOS 4K Static Ram" by Osamu Minato et al., IEEE Transactions on Electronic Devices, ED-26, No. 6, June, 1979, this amplifier is composed of first and second N-channel source-coupled input MOS transistors and first and second P-channel load MOS transistors whose drains are connected respectively to the drains of the first and second input MOS transistors. The gates of the first and second load MOS transistors are connected in common to the drain of the first input transistor, and a differential input signal is applied between the gates of the first and second input transistors.

In such sense amplifier, the drain voltages of the first and second input transistors do not vary symmetrically with respect to a certain voltage level because a load circuit has an asymmetrical configuration. The drain voltage (an output voltage of the sense amplifier) of the second input transistor can vary from a $V_{SS}$ voltage level (source voltage level of the first and second input transistors, typically ground level) to a $V_{DD}$ voltage level (source voltage level of the first and second load transistors, typically 5 V), depending on the amplitude of the input signal. Accordingly, this sense amplifier may suitably be used for amplifying a small signal to a large signal at once. However, such large amplification involves a substantial amplification delay since a stray capacitance is coupled to a node between the second input transistor and the second load transistor.

In order to avoid such amplification delay, it is advisable to perform two-stage amplification in which a small signal (approx. 0.5 V) is first amplified to a medium signal (approx. 1 V), which is then amplified to a large signal (3 V to 5 V). An amplifier including a load circuit with a symmetrical configuration is preferably used as a first-stage amplifier in order to utilize a differential amplifier as a second-stage amplifier and to enable balanced coupling between these two amplifiers.

An object of this invention is to provide a CMOS sense amplifier capable of balanced coupling with a differential amplifier and involving less amplification delay.

The above object is attained by connecting the drains of first and second input MOS transistors of a first channel type having their sources connected with each other and their gates connected to receive a differential input signal therebetween with a load circuit including first and second load MOS transistors of a second channel type whose sources are connected with each other, whose drains are connected in common to the drain of the first input transistor, and whose gates are connected respectively to the drains of the first and second input transistors, and third and fourth load MOS transistors of the second channel type whose sources are connected with each other, whose drains are connected in common to the drain of the second input transistor, and whose gates are connected respectively to the drains of the first and second input transistors.

This invention can be more fully understood from the following detailed description when taken in conjunction with the accompanying drawings, in which.

Figure 1:
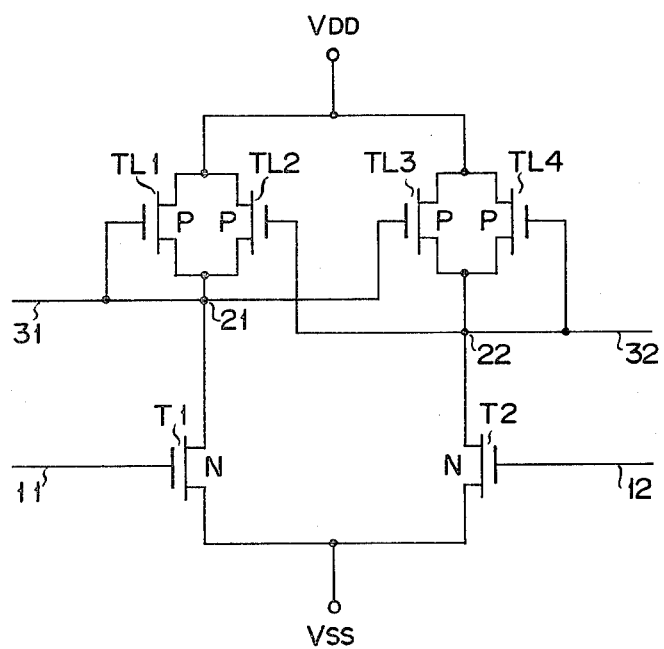
FIG. 1 shows a CMOS sense amplifier according to this invention.

As shown in FIG. 1, a CMOS sense amplifier according to this invention includes a pair of input MOS transistors T1 and T2 of a first channel type (shown as N channel type) and four load MOS transistors TL1, TL2, TL3, and TL4 of a second channel type (shown as P channel type). The input transistors T1 and T2 have their sources connected in common to a reference potential source $V_{SS}$ (e.g. ground) and their gates connected respectively to a pair of input signal lines or digit lines 11 and 12 that are connected to the respective complementary outputs of memory cells.

One pair of load transistors TL1 and TL2 has its sources connected in common to a potential source $V_{DD}$ (+5 V, typically) and its drains coupled in common to the drain of the input transistor T1. As for the other pair of load transistors TL3 and TL4, its sources are connected in common to the potential source $V_{DD}$ and its drains coupled in common to the drain of the input transistor T2.

A node 21 between the input transistor T1 and the load transistors TL1 and TL2 and a node 22 between the input transistor T2 and the load transistors TL3 and TL4 are connected to output lines 31 and 32, respectively. The gates of the load transistor TL1 and TL3 are connected to the output line 31, while the gates of the load transistors TL2 and TL4 are connected to the output line 32. All the transistors used are of an enhancement type.

Now there will be described the operation of the CMOS sense amplifier shown in FIG. 1. Here let it be supposed that each N-channel transistor has a threshold voltage of approximately +0.6 V and each P-channel transistor has a threshold voltage of about −0.6 V. Further, the load transistors TL1 to TL4 have an equal ratio of the channel width to the channel length. When the memory cells connected to the input signal lines 11 and 12 are not in the read mode, the gates of the input transistors T1 and T2 are each maintained at a given potential, e.g. at +3 V; therefore the differential input signal is zero volt. At this time, the potentials of output lines 31 and 32 are equal, e.g. approximately 2.5 V, so that the differential output voltage is zero volt.

When data is read out of one of the memory cells connected to the input signal lines 11 and 12, the potential of one of the input signal lines 11 and 12 is reduced from 3 V to 2.5 V, depending on whether the data is "1" or "0". For example, the potential of the signal line 12 is reduced when the data is "1". Here let it be supposed for a better understanding of the operation that the load transistors TL1 and TL4 do not exist. A reduction of the gate potential of the input transistor T2 causes the drain voltage of the transistor T2 to increase. As a result, the gate-source voltage of the load transistor TL2 is decreased to lower the drain voltage of the input transistor T1. The reduction of the drain voltage of the input transistor T1 leads to an increase of the gate-source voltage of the load transistor TL3. Accordingly, the drain voltage of the input transistor T2 further increases and the drain voltage of the input transistor T1 further decreases. Namely, cross-coupling of the gates of the load transistors TL2 and TL3 to the drains of the input transistors T2 and T1 provides a positive feedback, thereby considerably increasing the amplification of the sense amplifier. In other words, the sense amplifier composed of the input transistors T1 and T2 and the load transistors TL2 and TL3 performs an operation resembling a flip-flop operation and involving a substantial amplification delay.

The load transistors TL1 and TL4 provide a negative feedback. The considerable reduction of the drain voltage of the input transistor T1 is prevented by the load transistor TL1 because the reduction of the drain voltage of the input transistor T1 causes the source-gate voltage of the load transistor TL1 to increase, thereby raising the drain voltage of the input transistor T1. The increase of the drain voltage of the input transistor T1 causes the source-gate voltage of the load transistor TL1 to drop, thereby lowering the drain voltage of the input transistor T1. The same thing can be said about the input transistor T2 and the load transistor TL4.

As is evident from the above description, since the positive feedback provided by the load transistors TL2 and TL3 and the negative feedback provided by the load transistors TL1 and TL4 offset each other, the sense amplifier of the invention can be set to have an amplification with almost no amplification delay. If a differential input signal of 0.5 V is applied between the input signal lines 11 and 12, for example, a differential output voltage of approximately 1 V will appear between the output lines 31 and 32. Even if the threshold voltage and effective channel length of the transistors used vary from a set value with a manufacturing process, the sense amplifier of the invention will be able to operate stably by virtue of negative feedback action. Additionally, with the sense amplifier of this invention, an output voltage up to the supply voltage $V_{DD}$ can be obtained at the output line 31 or 32 when the input signal is large.

Figure 2:
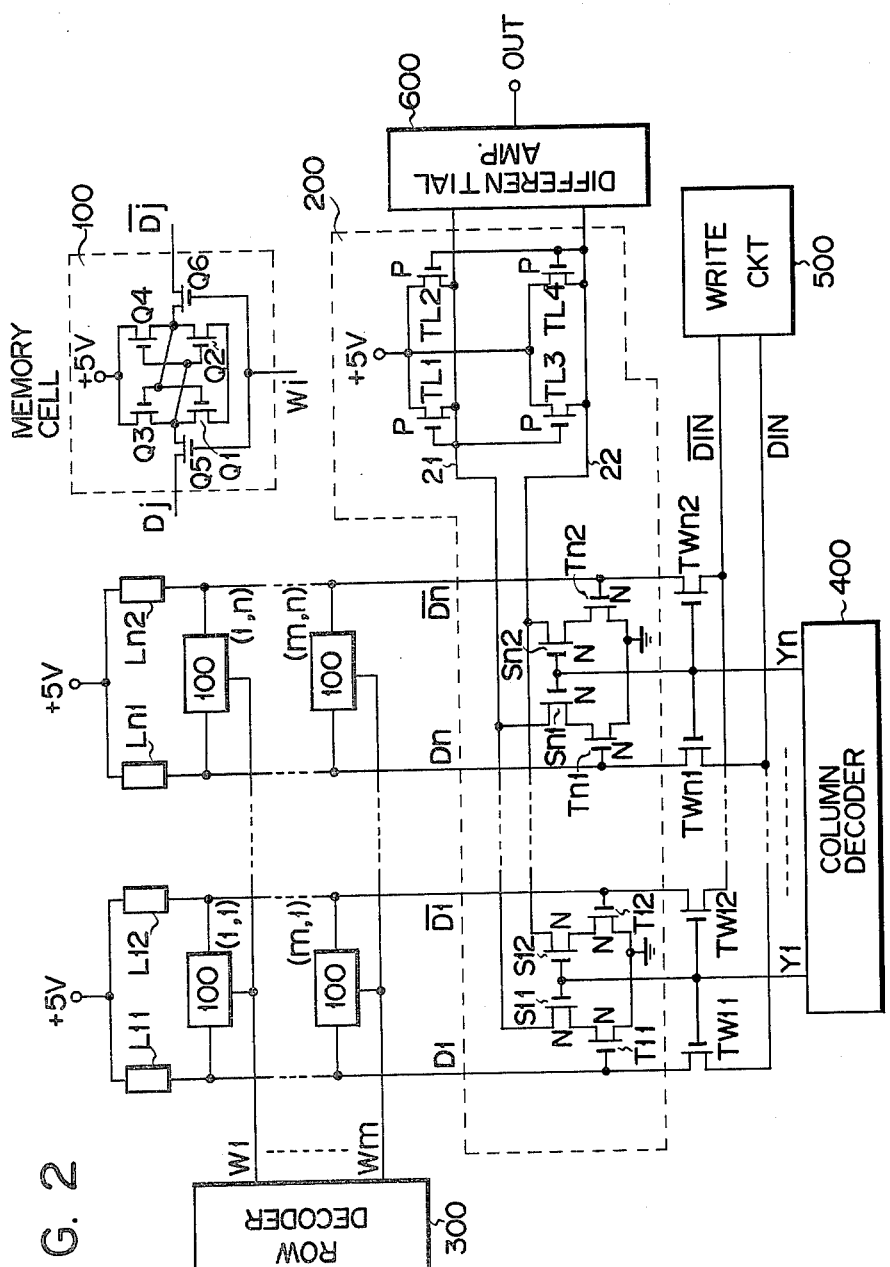
FIG. 2 shows a static RAM using the CMOS sense amplifier of the invention.

FIG. 2 is a circuit diagram of an MOS-type RAM including a CMOS sense amplifier 200 according to this invention. In FIG. 2, memory cells 100 are arranged in a matrix array of m rows×n columns. Each memory cell is composed of four N-channel transistors Q1, Q2, Q5 and Q6 and two P-channel transistors Q3 and Q4 connected in a conventional manner. Memory cells are connected to word lines Wi (i=1, 2, . . . ,m) as illustrated. Further, the memory cells are connected to digit line pairs Dj and $\overline{Dj}$ (j=1, 2, . . . ,n) as illustrated. The word lines Wi are selectively driven by a row decoder 300. The digit line pairs Dj and $\overline{Dj}$ are connected to a power source terminal (+5 V) via load devices Lj1 and Lj2, respectively. The digit lines Dj and $\overline{Dj}$ are connected respectively through MOS transistors TWj1 and TWj2 for write selection to input data lines DIN and $\overline{DIN}$, respectively, that are connected to a write circuit 500. The gates of the write-selection transistors TWj1 and TWj2 are selectively driven in common by an output Yj of a column decoder 400.

The sense amplifier 200 includes N-channel input transistor pairs Tj1 and Tj2 whose gates are connected respectively to the digit line pairs Dj and $\overline{Dj}$, whose sources are grounded in common, and whose drains are connected respectively to first and second output terminals 21 and 22 via N-channel switching transistors Sj1 and Sj2. The first output terminal 21 is connected with the drains of first and second P-channel load transistors TL1 and TL2, while the second output terminal 22 is connected with the drains of third and fourth P-channel load transistors TL3 and TL4. The source of the load transistors TL1 to TL4 are connected to a power source of e.g. 5 V. the gates of the first and third load transistors TL1 and TL3 are connected to the first output terminal 21, while the gates of the second and fourth load transistors TL2 and TL4 are connected to the second output terminal 22. The gates of the switching transistors Sj1 and Sj2 are driven in common by the output Yj of the column decoder 400. The output terminals 21 and 22 of the CMOS sense amplifier 200 are connected to the input terminals of a next-stage differential amplifier 600.

In the aforementioned RAM circuit, the input data lines DIN and $\overline{DIN}$ are both at a high level (5 V) in the read mode. When the j column is selectively accessed, the output Yj of the column decoder 400 is at the high level (5 V). Accordingly, one of the write-selection transistors TWj1 and TWj2 is off and the other acts as a load having a small conductance. The switching transistors Sj1 and Sj2 are on. The input transistors Tj1 and Tj2 and the load transistors TL1 to TL4 constitute the sense amplifier of FIG. 1.

In the RAM circuit shown in FIG. 2, a very small differential input signal (approx. 0.5 V) read out of one memory cell is quickly amplified to a differential output signal of medium amplitude (approx. 1 V) by the sense amplifier 200 of this invention, and further the medium-amplitude differential output signal is amplified to a large-amplitude output signal (3 to 5 V) by the next-stage differential amplifier 600.

In order to realize a high-speed operation of the CMOS sense amplifier 200, it is desired that the ratio ($\beta_L$) of the channel width to the channel length of the P-channel load transistors TL1 to TL4 should be greater than the ratio ($\beta_D$) of the channel width to the channel length of the N-channel input transistors. The greater the ratio $\beta_D/\beta_D$, the smaller the amplitude of the differential output signal appearing at the output terminals will be. On the contrary, the amplification speed of the sense amplifier increases as $\beta_L/\beta_D$ increases with $\beta_D$ fixed.

Further, the amplification of the sense amplifier may be increased in the following manner. Namely, the ratio $\beta_{L14}$ of the channel width to the channel length of each of the P-channel load transistors TL1 and TL4 is made different from the ratio $\beta_{L23}$ of the channel width to the channel length of each of the P-channel load transistors TL2 and TL3 such that the former becomes smaller than the latter. By so doing, the applification can be increasingly adjusted in such as a manner that the amplification speed is not correspondingly lowered.

What is claimed is:
1. A memory circuit comprising:
(a) a plurality of memory cells arranged in rows and columns;

(b) a plurality of word lines each being connected to ones of said memory cells in a different row and being used for selecting said memory cells in that row;

(c) a plurality of pairs of digit lines, each of said pairs being connected to ones of said memory cells in a different column of memory cells such that when a memory cell is selected by one of said word lines, the output of said selected memory cell appears across the pair of digit lines connected to said selected memory cell;

(d) a plurality of column lines each corresponding to a different one of said digit line pairs;

(e) a plurality of sense preamplifiers, each of said sense preamplifiers being coupled to a different one of said plurality of digit line pairs and being activated by a column line corresponding to the digit line pair coupled to the preamplifier, each of said sense preamplifiers including first and second MOS input transistors of a first channel type each having a gate, drain and source, said sources of said input transistors being connected together and said gates of said input transistors being connected to a different one of the digit lines in the digit line pair coupled to the preamplifier, and first and second MOS switching transistors of said first channel type, each of said switching transistors having a gate, drain and source, said sources of said switching transistors being connected respectively to said drains of said first and second input MOS transistors and said gates of said switching MOS transistors being connected to the column line corresponding to said coupled digit line pair;

(f) a load circuit connected to each of said plurality of sense preamplifiers, said load circuit including first and second load MOS transistors of a second channel type each having a gate, drain and source, and drains of said first and second load MOS transistors being connected to said drains of said first switching MOS transistors in each of said sense preamplifiers and said gates of said first and second load MOS transistors being connected respectively to said drains of said first and second switching MOS transistors in each of said sense preamplifiers, and third and fourth load MOS transistors of said second channel type each having a gate, drain and source, said drains of said third and fourth load MOS transistors being connected to said drains of said second switching MOS transistors in each of said sense preamplifiers and said gates of said third and fourth load MOS transistors being connected respectively to said drains of said first and second switching MOS transistors in each of said sense preamplifiers; and (g) a differential amplifier having one input connected to said gates of said first and third load MOS transistors in said load circuit and another input connected to said gates of said second and fourth transistors, the output of said differential amplifier indicating the contents of a memory cell selected by a work line and coupled, through a digit line pair, to a sense preamplifier selected by a column line.

2. A memory circuit according to claim 1, wherein said first and second channel types are N and P channel types, respectively.

3. A memory circuit according to claim 1, wherein the ratio of channel width to channel length of said first to fourth load MOS transistors in said load circuit is greater than that of said first and second input MOS transistors in said sense perampifier circuits.

4. A memory circuit according to claim 1, wherein the ratios of channel width to channel length of said first to fourth load MOS transistors are substantially equal to each other.

5. A memory circuit according to claim 1, wherein the ratio of channel width to channel length of each of said first and fourth load MOS transistors is smaller than that of each of said second and third load MOS transistors.

* * * * *